(12) United States Patent
Tamari

(10) Patent No.: US 10,727,371 B2
(45) Date of Patent: Jul. 28, 2020

(54) SEMICONDUCTOR LIGHT-EMITTING ELEMENT AND METHOD FOR PRODUCING SAME

(71) Applicant: STANLEY ELECTRIC CO., LTD., Meguro-ko, Tokyo (JP)

(72) Inventor: Naoki Tamari, Tokyo (JP)

(73) Assignee: STANLEY ELECTRIC CO., LTD., Tokyo (JP)

(*) Notice: Subject to any disclaimer, the term of this patent is extended or adjusted under 35 U.S.C. 154(b) by 8 days.

(21) Appl. No.: 16/322,094

(22) PCT Filed: Jul. 31, 2017

(86) PCT No.: PCT/JP2017/027708
§ 371 (c)(1),
(2) Date: Jan. 30, 2019

(87) PCT Pub. No.: WO2018/025805
PCT Pub. Date: Feb. 8, 2018

(65) Prior Publication Data
US 2019/0172975 A1    Jun. 6, 2019

(30) Foreign Application Priority Data

Aug. 2, 2016  (JP) ................... 2016-152298

(51) Int. Cl.
*H01L 33/32* (2010.01)
*H01L 33/10* (2010.01)
(Continued)

(52) U.S. Cl.
CPC ........... *H01L 33/32* (2013.01); *H01L 33/10* (2013.01); *H01L 33/22* (2013.01); *H01L 33/36* (2013.01)

(58) Field of Classification Search
CPC .......... H01L 33/10; H01L 33/22; H01L 33/32; H01L 33/36
See application file for complete search history.

(56) References Cited

U.S. PATENT DOCUMENTS 10,002,989 B2 * 6/2018 Ide .................... H01L 33/12
2007/0114511 A1   5/2007 Kim et al.
(Continued)

FOREIGN PATENT DOCUMENTS

JP    H10209496 A    8/1998
JP    H10270754 A    10/1998
(Continued)

OTHER PUBLICATIONS

International Search Report (ISR) dated Sep. 19, 2017 issued in International Application No. PCT/JP2017/027708.
(Continued)

*Primary Examiner* — Andrew Q Tran
(74) *Attorney, Agent, or Firm* — Holtz, Holtz & Volek PC

(57) ABSTRACT

An ultraviolet light-emitting element includes a support substrate, a group III-V nitride semiconductor layer structure mounted on a mounting surface of the support substrate and including an n-type semiconductor layer, a light-emitting layer, a p-type cladding layer and a p-type contact layer stacked in this order on the support substrate, and an n-type electrode and a p-type electrode mounted on the n-type semiconductor and p-type contact layer, respectively. The support substrate has an indented portion formed on at least a part of a light emitting surface of the support substrate opposite to a mounting surface of the n-type semiconductor layer. An area of the n-type semiconductor layer surface exposed to the outside is at least 20% and at most 90% in largeness. Areas of the p-type contact layer surface and p-type electrode surface exposed to the outside are at least 5% and at most 50% in largeness.

6 Claims, 1 Drawing Sheet

(51) Int. Cl.
*H01L 33/22* (2010.01)
*H01L 33/36* (2010.01)

(56) References Cited

U.S. PATENT DOCUMENTS

| | | |
|---|---|---|
| 2010/0019257 A1 | 1/2010 | Sakai et al. |
| 2015/0247260 A1 | 9/2015 | Koukitu et al. |
| 2016/0163937 A1 | 6/2016 | Inoue et al. |
| 2018/0248088 A1 | 8/2018 | Inoue et al. |

FOREIGN PATENT DOCUMENTS

| | | |
|---|---|---|
| JP | 2005354020 A | 12/2005 |
| JP | 2006253647 A | 9/2006 |
| JP | 2007273975 A | 10/2007 |
| JP | 2008141015 A | 6/2008 |
| JP | 2015531739 A | 11/2015 |
| JP | 2016111085 A | 6/2016 |
| WO | 2005004247 A1 | 1/2005 |
| WO | 2015016150 A1 | 2/2015 |

OTHER PUBLICATIONS

Written Opinion dated Sep. 19, 2017 issued in International Application No. PCT/JP2017/027708.

* cited by examiner

SEMICONDUCTOR LIGHT-EMITTING ELEMENT AND METHOD FOR PRODUCING SAME

TECHNICAL FIELD

The present invention relates to an ultraviolet light-emitting element such as a light-emitting diode (LED), and more particularly, to an ultraviolet light-emitting element which has an improved light extraction property of light emitted from the element to the outside.

BACKGROUND ART

In an ultraviolet light-emitting element, an n-type semiconductor layer, a light-emitting layer, and a p-type semiconductor layer are stacked in this order on a support substrate. Furthermore, a p-type electrode is formed on the p-type semiconductor layer, and an n-type electrode is formed on the n-type semiconductor layer. When a voltage is applied between the p-type electrode and the n-type electrode of the ultraviolet light-emitting element having such a configuration, holes of the p-type semiconductor layer and electrons of the n-type semiconductor layer recombine in the light-emitting layer, so as to radiate (emit) light corresponding to the band gap of the light-emitting layer. The light emitted by the above-described light-emitting layer is extracted to the outside after passing through the respective layers of the ultraviolet light-emitting element. In case of the ultraviolet light-emitting element having the aforementioned configuration, since the electrodes using Ni, Au, or the like and a p-type contact layer mainly composed of GaN absorb ultraviolet light, almost no light can be extracted from the electrode surface side. Therefore, it is common that the light emitted from the above-described light-emitting layer passes through the n-type semiconductor layer and the support substrate from the light-emitting aver, so that the light is extracted from the support substrate side. In order to efficiently extract light from the support substrate side, it is necessary that the layers of the semiconductor element from the light-emitting layer up to the support substrate and the support substrate have high transmittance with respect to the emission wavelength.

When light passes through the boundary of media having different refractive indices, that is, through layer interface, a surface, or the a certain proportion of light is inevitably reflected. In particular, when light travels from a medium having a large refractive index to a medium having a small refractive index, total reflection of light occurs, so that light incident at a critical angle or greater cannot be extracted to the outside. At the surface of the semiconductor light-emitting element, that is, at the interface between air (or sealing material) and the ultraviolet light-emitting element, since the refractive index difference between the two media becomes large, the critical angle at which total reflection occurs becomes small. As a result, the proportion of light totally reflected at the interface increases, resulting in a problem of deterioration of the light extraction efficiency. For example, if an AlN single crystal with a refractive index of 2.4 is used as the support substrate, the critical angle is calculated to be 24.6° according to Snell's law, and thus, all light with angles of incidence greater than that critical angle is totally reflected. Therefore, it is known that, in a semiconductor light-emitting element in which an AlGaN layer is stacked on an AlN substrate as a light-emitting layer, the extraction efficiency of light that can be extracted from the surface (light extraction surface) side of the AlN substrate is extremely low, i.e., the efficiency is about 4% on the basis of calculation.

Therefore, in order to cope with such a problem, a semiconductor light-emitting element in which an indented or rough surface structure on the nanometer scale is provided on the substrate surface (light extraction surface) has been proposed for The purpose of improving the light extraction efficiency. For example, Patent Literature 1 discloses that an indented structure having an average period of not more than twice the average optical wavelength of light emitted from a light-emitting layer is provided on a light extraction surface. There has been proposed a method of reducing the proportion of the split of the light totally reflected at the light extraction surface (that is, suppressing the reflection of the light on the element surface) by forming such an indented structure. Although the light extraction efficiency is improved by such a method, the light extraction efficiency varies greatly depending on the shape of the indented structure and the emission wavelength Therefore, it cannot be said that sufficiently improved light extraction efficiency is achieved, and further improvement of the light extraction efficiency has been demanded.

From this point of view, various studies have been made on the indented structure to be provided on the substrate surface (light extraction surface). For example, Patent Literature 2 has proposed a semiconductor light-emitting element in which at least one of the light extraction surface and an interface between two layers having different refractive indices in the semiconductor light-emitting element is provided with a periodically indented structure having a period exceeding 0.5 times the wavelength of light emitted from the light-emitting layer and a minutely indented structure located on the surface of the periodically indented structure and having an average diameter of 0.5 times or less the wavelength of light.

In this manner, the total reflection inside the support substrate can be reduced by forming the indented structure on the light extraction surface. However, not all the light can be extracted to the outside because there is light that cannot be extracted to the outside due to the influence of scattering or Fresnel reflection at the interface of the support substrate. When these rays of light reach the light extraction surface again by changing the traveling direction thereof due to interface reflection or the like between the layers of the ultraviolet light-emitting element, some of the rays of light are extracted to the outside in the same manner, and the remaining rays of light are reflected to the layer side of the ultraviolet light-emitting element. As described above, the light which is not extracted to the outside is repeatedly reflected and propagated between the support substrate and the layers of the ultraviolet light-emitting element, but the light intensity is gradually attenuated by absorption in the layers of the ultraviolet light-emitting element and the electrodes, so that the light disappears in time. Therefore, in order to further enhance the light extraction efficiency, it is important to reduce loss of light such as absorption in addition to the formation of the indented structure.

Therefore, Patent Literature 3 proposes a light-emitting element in which an indented portion formed from recessed portions and projecting portions at a pitch larger than the wavelength of the light emitted from the light-emitting layer in the semiconductor layer is provided to the whole or a part of the surface of the ultraviolet light-emitting element from which the light is to be extracted, and a reflective layer using a metal such as aluminum having a high reflectance of the light or a DBR is provided to the surface of the semiconductor layer opposite to the surface thereof from which the light is extracted.

CITATION LIST

Patent Literature

Patent Literature Japanese Patent Application Laid-Open No. 2005-354020

Patent Literature 2: international Publication No. WO2015/016150

Patent Literature 3: Japanese Patent Application Laid-Open No. 2007-273975

SUMMARY OF INVENTION

Technical Problem

However, when the inventors of the present invention examined the ultraviolet light-emitting element by the method described in Patent Literature 3 described above, it has been found that, even if the reflective layer is stacked on the semiconductor surface, sufficient light extraction efficiency may not be obtained depending on the layer configuration of the ultraviolet light-emitting element. Further, aluminum is used as a metal having a high reflectance with respect to ultraviolet light as the above-described reflective layer, but aluminum is extremely difficult to obtain an ohmic junction with respect to the p-type contact layer the p-type semiconductor layer, and so it has been found that there is a problem that the luminous efficiency is lowered.

It is therefore an object of the present invention to provide an ultraviolet light-emitting element having a higher light extraction efficiency than those by the conventional techniques.

Solution to Problem in order to solve the above-described problems, the inventors of the present invention have conducted intensive studies. In an ultraviolet light-emitting element in which an n-type semiconductor layer, a light-emitting layer, and a p-type semiconductor layer are stacked in this order on a support substrate, a p-type contact layer is formed on the p-type semiconductor layer (p-type cladding layer) in order to easily realize an ohmic contact with the p-type electrode and to reduce the contact resistance with the p-type electrode. As the p-type contact layer, a p-type AlGaN layer or a p-type GaN layer having a smaller band gap and a smaller Al composition than those of the p-type cladding layer is used. However, the inventors have found that, since the p-type AlGaN layer and the p-type GaN layer having low Al compositions used in the contact layer absorb ultraviolet light, even if the reflective layer is provided on the surface of the semiconductor layer, the p-type contact layer absorbs light before the light reaches the reflective layer, so that sufficient light extraction efficiency is not obtained. Therefore, as a result of detailed studies on the layer configuration in the ultraviolet light-emitting element having the aforementioned configuration, it has been found that ultraviolet light emitted from the light-emitting layer is totally reflected at the interface between the re-type semiconductor layer and air. As a result of further studies on the layer configuration of the ultraviolet light-emitting element, it has been found that the light extraction efficiency from the light extraction surface of the support substrate is improved by controlling the exposed area of the n-type semiconductor layer and the exposed areas of the p-type contact layer and the p-type electrode in the semiconductor layer of the ultraviolet light-emitting element, whereby the present invention has been completed.

Specifically, the present invention provides an ultraviolet light-emitting element having: a support substrate; a group III-V nitride semiconductor layer structure mounted on a mounting surface of said layer structure, said layer structure including an n-type semiconductor layer, a light-emitting layer, a p-type cladding layer and a p-type contact layer which are stacked in this order on said support substrate; an n-type electrode mounted on the n-type semiconductor layer; a p-type electrode mounted on the p-type contact layer; wherein said support substrate having an indented portion formed on at least a part of a light emitting surface of the support substrate opposite to the mounting surface of the n-type semiconductor layer, wherein an area of the n-type semiconductor layer surface being an exposed area which is exposed to the outside at an area of the ultraviolet light-emitting element is 20% or more and 90% or less in largeness, and exposed areas of the p-type contact layer surface and the p-type electrode surface which are exposed to the outside at the remaining area is 5% or more and 50% or less in largeness.

The ultraviolet light-emitting element of the present invention described above can suitably adopt the following aspects.

1) The n-type semiconductor layer has a refractive index of 2.0 or more at the emission wavelength.

2) The support substrate has an absorption coefficient of 30 cm$^{-1}$ or less at the emission wavelength.

3) The n-type semiconductor layer has an absorption coefficient of 10 cm or less at the emission wavelength.

4) The support substrate is an AlN single crystal substrate.

5) The p-type cladding layer is a p-type AlGaN layer represented by a composition formula $Al_xGa_{1-x}N$ ($0<X\le1$), and the p-type contact layer is a p-type AlGaN layer represented by a composition formula $Al_yGa_{1-y}N$ ($0<Y\le1$, and $Y\le X$).

According to the present invention, is possible to improve the light extraction efficiency from the light extraction surface in the ultraviolet light emitting element.

The ultraviolet light-emitting element of the present invention is characterized in that the exposed areas of the p-type contact layer and the p-type electrode which absorb the ultraviolet light emitted from the light-emitting layer are controlled, and that the exposed area of the n-type semiconductor layer which has the property of totally reflecting the ultraviolet light at the air interface is increased. With such a configuration of the present invention, light reflected internally at the light extraction surface forming the indented structure can be reflected (totally reflected) at the interface between the n-type semiconductor layer and air, and extracted to the outside from the light extraction surface. In addition, it is possible to prevent the reflected light from being absorbed by the p-type contact layer and the p-type electrode. Further, it is unnecessary to use a metal as the reflective layer, and the contact property of the electrode is not impaired. Furthermore, when a material having a high refractive index is used for the n-type semiconductor layer, the critical angle of total reflection occurring at the interface with air can be reduced, and most of the light can be reflected toward the light extraction surface without loss. In addition, when an n-type semiconductor layer and a support substrate having high transmittance to ultraviolet light are

DESCRIPTION OF EMBODIMENTS (Ultraviolet Light-Emitting Element)

Figure 1:
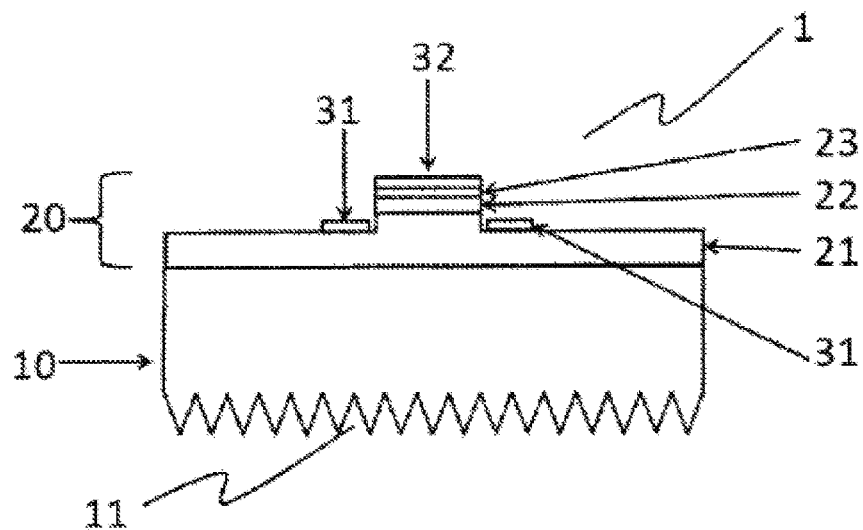
FIG. 1 is a schematic cross-sectional view illustrating an example of an ultraviolet light-emitting element of the present invention.

First, the ultraviolet light-emitting element of the present invention will be described. FIG. 1 is a schematic cross-sectional view of an example of the ultraviolet light-emitting element of the present invention.

In the ultraviolet light-emitting element 1, a semiconductor layer 20 is stacked on a support substrate 10. The semiconductor layer 20 is configured such that an n-type semiconductor layer 21, a light-emitting layer 22, and a p-type semiconductor layer 23 are stacked in this order on the support substrate 10. The p-type semiconductor layer has a p-type cladding layer on the light-emitting layer and a p-type contact layer on the p-type cladding layer. An n-type electrode 31 and a p-type electrode 32 are formed on the n-type semiconductor layer 21 and the p-type semiconductor layer 23, respectively. An indented structure 21 is formed on a light extraction surface 11 on a side of the support substrate 16 opposite to the stacked layer surface of the semiconductor layer. Also, there may be a buffer layer between the support substrate 10 and the n-type semiconductor layer 21 to reduce the difference in lattice constant between the support substrate 10 and re-type semiconductor layer.

The ultraviolet light-emitting element of the present invention is characterized in that the exposed areas of the p-type contact layer and the p-type electrode which absorb the ultraviolet fight emitted from the light-emitting layer are controlled, and that the exposed area of the n-type semiconductor layer which has the property of totally reflecting the ultraviolet light at the air interface is increased. That is, in the ultraviolet light-emitting element of the present invention, when the semiconductor layer of the light-emitting element is viewed from above, the exposed area of the n-type semiconductor layer surface which is exposed to the outside at the area of the ultraviolet light-emitting element needs to be 20% or more and 90% or less, and the exposed areas of the p-type contact layer surface and the p-type electrode surface which are exposed to the outside at the remaining area need to be 5% or more and 50% or less.

Figure 2:
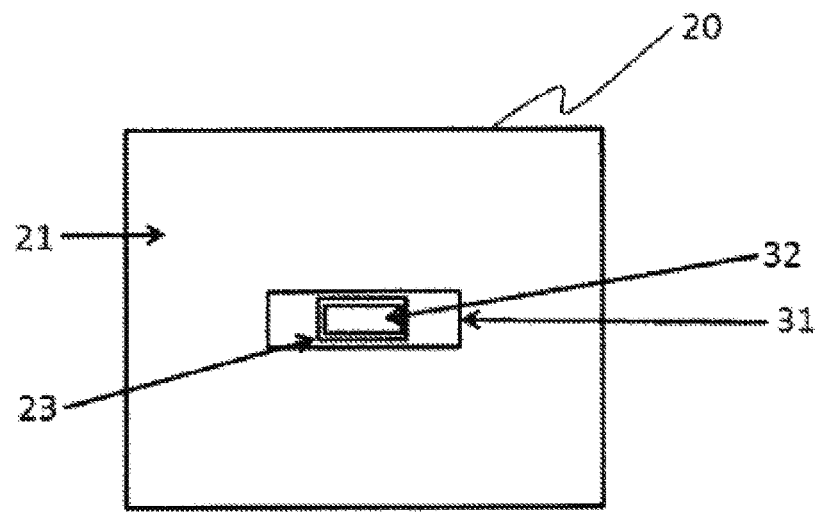
FIG. 2 is a schematic top view of the ultraviolet light-emitting element in FIG. 1 viewed from the side of the semiconductor layer.

FIG. 2 is a schematic top view of the ultraviolet light-emitting element in FIG. 1 viewed from the side of the semiconductor layer. In the schematic view, the p-type electrode 32 is formed in the center portion of the semiconductor layer 20, and the p-type semiconductor layer 23 is disposed around the p-type electrode 32, and the n-type electrode 31 is disposed around the p-type semiconductor layer 23. The region around the n-type electrode 31 is the n-type semiconductor layer 21, the area of the n-type semiconductor layer 21 in the area of the semiconductor layer 20 is 20% or more and 90% or less in largeness, and the exposed areas of the p-type contact layer 23 and the p-type electrode 32 in the remaining area are 5% or more and 50% or less in largeness.

As described above, the ultraviolet light emitted from the light-emitting layer is totally reflected at the interface between the n-type semiconductor layer and air, while the electrode using a metal such as Ni or Au and the p-type contact layer have a property of absorbing ultraviolet light. Therefore, by making the exposed area of the n-type semiconductor layer as large as possible when the ultraviolet light-emitting element is viewed from above on the semiconductor layer side, absorption of ultraviolet light emitted from the light-emitting layer can be suppressed, and light extraction efficiency from the light extraction surface can be improved.

On the other hand, in order for the light-emitting layer to emit a sufficient amount of ultraviolet light, it is necessary to supply a sufficient current to the ultraviolet light-emitting element. Therefore, as the exposed areas of the electrodes are reduced, it is necessary to increase the voltage applied to the electrodes, which may cause deterioration of the electrodes due to a long operation time.

Therefore, in consideration of the relationship between the light extraction efficiency and the applied voltage, the exposed area of the n-type semiconductor layer is preferably in the range of 30% or more and 70% or less in largeness. The exposed areas of the p-type contact layer and the p-type electrode in the remaining area are preferably in the range of 10% to 40% in largeness.

Hereinafter, each of the constituent elements will be described individually.

<Support Substrate 10>

The support substrate 10 in the ultraviolet light-emitting element of the present invention is not particularly limited as long as it is a substrate used in ultraviolet light-emitting elements using semiconductors, and a known substrate produced by a known method can be used. Specific examples thereof include an AlN substrate, a GaN substrate, a sapphire substrate, an SiC substrate, and an. Si substrate. Among these, an AlN substrate and a sapphire substrate are preferable from the viewpoint of transmittance to ultraviolet light (210 to 365 nm).

<Light Extraction Surface 11>

The light extraction surface 11 of the support substrate is on the side of the support substrate 10 opposite to the stacked layer surface of the semiconductor layers, and the indented structure is formed on at least a part of a light extraction surface 16A. The arrangement of the projecting portions of the indented structure may be periodic or random. The height of the projecting portion may be uniform or random, but it is preferable that the height satisfy a range of 20 nm or more and 3000 nm or less. The shape of the projecting portion is not particularly limited, but a columnar body, a cone, a sphere, or the like may be mentioned.

Although there are various methods for forming the indented structure, a method including forming a mask pattern by an electron beam lithography method, a photolithography method, a nanoimprint lithography method, or the like and then processing a substrate by dry etching such as TOP or RTE has been known as long as the structure is periodic the dry etching step, it is preferable use a chlorine-based gas, a fluorine-based gas, or a bromine-based gas as an etching gas. Alternatively, a gas in which hydrogen, oxygen, argon, or the like is mixed with the above-mentioned etching gas may be used. On the other hand, in case of a random structure, it can be formed by wet etching or the like method.

Further, a sealing material such as a resin, glass, or quartz may be formed on the indented structure.

<Group III-V Nitride Semiconductor Layer 20>

The group III-V nitride semiconductor layer 20 in which the n-type semiconductor layer 21, the light-emitting layer 22, the p-type cladding layer, and the p-type contact layer are stacked in this order is formed on the support substrate 10. The III-V group nitride semiconductor is represented by a composition formula $Al_xIn_yGa_zN$ (x, y, z are rational numbers satisfying $0<x\leq1.0$, $0\leq y\leq0.1$, $0\leq z<1.0$, and $x+y+z=1.0$) (hereinafter, also referred to simply as "semiconductor layer"). A buffer layer for reducing the difference in lattice constant between the support substrate 10 and the n-type semiconductor layer 21 may be formed between the support substrate 10 and the re-type semiconductor layer 21.

The semiconductor layer 20 may be produced by, for example, a metal-organic chemical vapor deposition method (MOCVD method). Specifically, the n-type semiconductor layer 21, the light-emitting layer 22, and the p-type semiconductor layer 23 can be produced by successively performing crystal-growth by supplying a group III raw material gas, for example, an organometallic gas such as trimethylaluminum or trimethylgallium, and a nitrogen source gas, for example, a raw material gas such as an ammonia gas, onto the support substrate using a commercially available apparatus. As conditions for producing the ultraviolet light-emitting element by the MOCVD method, a known method may be employed. The ultraviolet light-emitting element may be produced by a method other than the MOCVD method. Examples of the other producing methods include a metal organic vapor phase epitaxy method (MOVPE method), a molecular beam epitaxy method (MBE), and a hydride vapor phase epitaxy method (HVPE method).

<N-Type Semiconductor Layer 21>

The n-type semiconductor layer 21 is represented by the above-described composition formula, and preferably satisfies the range of $0.3<x<1.0$ from the viewpoint of transmittance of ultraviolet light. The n-type semiconductor layer 21 is a single crystal layer doped with an n-type dopant. The n-type dopant is not particularly limited, but Si, Ge, or the like may be mentioned. The concentration of the n-type dopant may be $1.0\times10^{17}/cm^3$ or more and $1.0\times10^{21}/cm^3$ or less. In addition, from the viewpoint of both the crystallinity and the contact characteristics of the n-type semiconductor layer 21, the concentration of the n-type dopant is preferably $1.0\times10^{17}/cm^3$ or more and $1.0\times10^{21}/cm^3$ or less, and particularly preferably $1.0\times10^{18}/cm^3$ or more and $1.0\times10^{20}/cm^3$ or less.

The film thickness of the n-type semiconductor layer 21 is not particularly limited, and is usually selected in the range of 100 nm or more and 10,000 nm or less. From the viewpoint of crystallinity and conductivity, it is preferable that the film thickness be 500 nm or more and 5,000 nm or less.

<Light-Emitting Layer 22>

The light-emitting layer 22 is formed on the n-type semiconductor layer 21. The light-emitting layer 22 is a layer having at least one well layer. In case of a multiple quantum well structure having a plurality of well layers, the well layers and barrier layers composed of the above-described composition formula are alternately stacked. The composition of the well layer may be appropriately adjusted according to the emission wavelength, and the composition of the barrier layer may be determined so that the band gap energy of the well layer becomes smaller than the band gap energy of the barrier layer (x is made smaller and z is made larger). In case of an ultraviolet light-emitting element having an emission wavelength of 260 nm, the composition of the well layer is preferably $0.3<x<0.7$, and the composition of the barrier layer is preferably $0.4<x<1.0$. The film thickness of the well layer 22 is 1 nm or more, and is preferably 2 nm or more in consideration of production stability and the like. The upper limit value of the film thickness of the well layer is compatible with the emission wavelength, but is preferably 10 nm or less. The film thickness of the barrier layer is 1 nm or more, and is preferably 2 nm or more as in case of the well layer. The upper limit value of the film thickness of the barrier layer is preferably 30 nm or less.

<P-Type Semiconductor Layer 23>

The p-type semiconductor layer 23 is formed on the light-emitting layer 22. The p-type semiconductor layer 23 has the p-type cladding layer (not shown) on the light-emitting layer 22 and the p-type contact layer (not shown) thereon. The p-type semiconductor layer 23 is a single crystal layer represented by the above-described composition formula and doped with a p-type dopant. As the p-type dopant, Mg may be mentioned. The p-type cladding layer preferably has a higher band gap energy than that of the light-emitting layer 22. That is, the Al composition of the p-type cladding layer is preferably larger than the Al composition of the light-emitting layer. This is because electrons are efficiently confined in the light-emitting layer.

The concentration of the dopant in the p-type cladding layer is preferably $1.0\times10^{17}/cm^3$ or more and $1.0\times10^{21}/cm^3$ or less, and particularly preferably $1.0\times10^{18}/cm^3$ or more and $1.0\times10^{20}/cm^3$ or less.

In terms of the band gap energy, the composition of the p-type cladding layer is preferably $0.5<x>1.0$.

The thickness of the p-type cladding layer is not particularly limited, but is preferably 1 nm or more and 1 μm or less.

The p-type contact layer is formed on the p-type cladding layer 60. The formation of the p-type contact layer can easily realize the ohmic contact with the p-type electrode, and also reduction in contact resistance thereof.

The Al composition of the p-type contact layer is preferably smaller than the Al composition of the p-type cladding layer, and is preferably $0\leq x<0.3$ from the viewpoint of the contact property. The smaller the Al composition of the p-type contact layer is, the better the contact property with the p-type electrode 32 becomes. The concentration of the dopant in the p-type contact layer is preferably $1.0\times10^{17}/cm^3$ or more and $1.0\times10^{21}/cm^3$ or less, and particularly preferably $1.0\times10^{18}/cm^3$ or more and $1.0\times10^{20}/cm^3$ or less. The thickness of the p-type contact layer is not particularly limited, but is preferably 1 nm or more and 1,000 nm or less.

<Electrodes>

The n-type electrode 31 and the p-type electrode 32 are formed on the n-type semiconductor layer 21 and the p-type semiconductor layer 23, respectively. As described above, the ultraviolet light-emitting element of the present invention is characterized in that the exposed areas of the p-type contact layer and the p-type electrode 32 that absorb the ultraviolet light emitted from the light-emitting layer 22 are controlled, and the exposed area of the n-type semiconductor layer 21 which has the property of totally reflecting the ultraviolet light at the air interface is increased. That is, in the ultraviolet light-emitting element of the present invention, when the semiconductor layer of the light-emitting element is viewed from above, the exposed area of the n-type semiconductor layer 21 at the area of the ultraviolet light-emitting element needs to be 20% or more and 90% or less in largeness, and the exposed areas of the p-type contact layer and the p-type electrode 32 in the remaining area need to be 5% or more and 50% or less in largeness. In particular, in consideration of the relationship between the light extraction efficiency and the applied voltage, the exposed area of the n-type semiconductor layer 21 is preferably in the range of 30% or more and 70% or less in largeness. The exposed areas of the p-type contact layer and the p-type electrode 32 in the remaining area is preferably in the range of 10% to 40% in largeness.

Hereinafter, the electrode layer will be described in detail.

<N-Type Electrode 31>

The n-type electrode 31 is formed on the exposed surface of the n-type semiconductor layer 21. When the support substrate 10 has an n-type conductivity, an n-type electrode may be formed on the support substrate. The exposed surface of the n-type semiconductor layer 21 is formed as follows. An etching mask is formed on the ultraviolet light-emitting element wafer, and the p-type semiconductor layer 23, the light-emitting layer 22, and a part of the n-type semiconductor layer 21 are etched by dry etching such as inductively coupled plasma etching. The material of the n-type electrode on the thus exposed n-type semiconductor layer 21 is not particularly limited, but Al, Ti, V, Ni, Cr, No, Au, Si, ITO, or the like, or a compound containing the above-mentioned material may suitably be mentioned, and the n-type electrode may be a single layer or a multilayer. The method of forming a film of the above-mentioned material is preferably vacuum deposition or sputtering. Further, in order to improve the contact property of the n-type electrode, it is preferable to subject the n-type electrode to a heat treatment at 500° C. to 1100° C. for 10 seconds to 10 minutes.

<P-Type Electrode 32>

The p-type electrode 32 is formed on the p-type contact layer. The material of the p-type electrode 32 is not particularly limited, but Al, Ti, V, Ni, Cr, Mo, Au, Si, ITO, or the like, or a compound containing the above-mentioned material may suitably be mentioned, and the p-type electrode 32 may be a single layer or a multilayer. The method of forming a film of the above-mentioned. material is preferably vacuum deposition or sputtering. Further, in order to improve the contact property of the p-type electrode 32, it is preferable to subject the p-type electrode 32 to a heat treatment at 200° C. to 800° C. for 10 seconds to 10 minutes.

As a patterning method of the n-type electrode 31 and the p-type electrode 32, a photolithography method, an electron beam lithography method, an imprint lithography method, or the like may be mentioned; however, in consideration of productivity, a photolithography method is preferable. The process of the photolithography method will be described below. A photoresist is spin-coated on the epitaxial growth surface side of the ultraviolet light-emitting element wafer. Thereafter, the coated photoresist is partially irradiated with ultraviolet light through the photomask (exposure). Then, the wafer is exposed to an appropriate developing solution to transfer the pattern of the photomask thereto. A film of the electrode material is formed on the pattern thus produced and the photoresist is removed with an appropriate solvent to thereby pattern the electrode material.

As a method of patterning the electrode layer, the following method may also be mentioned. First, a film of an. electrode material is formed on the entire surface, and a photoresist is applied thereon, exposed, and developed to pattern the photoresist. Thereafter, using the photoresist as an etching mask, the electrode material is partially etched by dry etching or wet etching, and finally, the photoresist is removed with a suitable solvent. Thus, the electrode layer can be patterned.

EXAMPLES

The present invention will be described in detail below with reference to examples, but the present invention is not limited to the following examples.

Example 1

An n-type AlGaN layer, an active layer (light-emitting layer), and a p-type GaN were successively epitaxially grown on a single-crystal AlN substrate, which had been produced by an HVPE method, by an MOCVD method to obtain an ultraviolet light-emitting element wafer. The compositions were adjusted so that the emission wavelength was 265 nm.

An etching mask was formed on the wafer, and the region not covered with the etching mask was etched by an inductively coupled plasma (ICP) etching to partially expose the n-type semiconductor layer. Thereafter, an n-type electrode formed of Ti/Al/Au was formed on a part of the exposed portion of the n-type AlGaN layer, and then a p-type electrode formed of Ni/Au was sequentially formed on the p-type GaN layer. Then, a pad layer formed of Ti/Ni/Au was formed on the n-type electrode and the p-type electrode. Thereafter, the back surface of the AlN substrate was mechanically polished to obtain a wafer thickness of 100 μm.

In the plane on which the electrodes were formed, the electrode layout was designed so that the proportion of the region where the n-type AlGaN layer was exposed occupying the area of the entire chip was 87.1%, the proportion of the area of the n-type electrode occupying the area of the entire chip was 6.7%, the proportion of the area of the p-type electrode occupying the area of the entire chip was 5.4%, and the proportion of the region where the p-type GaN layer was exposed occupying the area of the entire chip was 0.8% (the exposed areas of the p-type contact layer and the p-type electrode in the remaining area was 48.1). The optical output of the ultraviolet light-emitting element thus produced was measured with a photodiode.

A UV curable resist was applied to the back surface (mechanical polished surface) of the produced ultraviolet light-emitting element wafer so as to have a film thickness of 120 nm, and a periodic structure having an arrangement period of 300 nm, a pillar height of 300 nm, and a diameter of 180 nm was transferred by a nanoimprint apparatus. The resist was cured by irradiating with UV light having a wavelength of 365 nm in a state where a resin mold was pressed at a pressure of 3 MPa.

Subsequently, the ultraviolet light-emitting element wafer was introduced into an TOP etching apparatus, and etching treatment was performed for 20 minutes using a trifluoromethane ($CHF_3$) gas. Thereafter, the UV-cured resist was treated with a UV ozone apparatus for 15 minutes to remove the residue of the UV-cured resist. Finally, the wafer was immersed in hydrochloric acid at 40° C. for 15 minutes. The purpose of immersion in hydrochloric acid is to spontaneously form a more minute indented structure than the periodic structure on the AlN substrate. The combination of the periodic structure and the minute structure smaller than the periodic structure can provide a higher optical output improvement effect. In order to prevent the electrode metal of the ultraviolet light-emitting element wafer from being corroded by hydrochloric acid, a photoresist was applied in advance to the surface of the semiconductor light-emitting element substrate on which the electrodes were formed, and cured to be used as a protective film. After immersion in hydrochloric acid, the semiconductor light-emitting element substrate was rinsed with ultrapure water, and the photoresist as a protective film was dissolved with a stripping solution.

As a result, an ultraviolet light-emitting element of Example 1 was produced, which was formed of the AlN substrate having a conical structure with an arrangement period of 300 nm, a height of 250 nm, and a diameter of 280 nm, and a minute structure with an average diameter of 30 nm. The optical output of the ultraviolet light-emitting element of Example 1 thus produced was measured with a photodiode.

The measurement of the optical output was performed using an optical evaluation apparatus manufactured by Optical System Corporation, and a value obtained by dividing the optical output after the indentation processing of the same element by the optical output before the indented processing was defined as the optical output ratio.

Examples 2 to 4, Comparative Examples 1 to 4

An ultraviolet light-emitting element was produced and the optical output of the ultraviolet light-emitting element was measured with a photodiode in the same manner as that in Example 1 except that the electrodes were laid out under the conditions of Table 1 for the exposed area of the n-type semiconductor layer in the area of the ultraviolet light-emitting element, and the exposed areas of p-type contact layer and the p-type electrode. The results are shown in Table 1.

TABLE 1

|  | n-type AlGaN layer | n-type Electrode | p-type Electrode | p-type Contact Layer | Exposed areas of p-type contact layer and p-type electrode in the remaining area | Optical output ratio |
| --- | --- | --- | --- | --- | --- | --- |
| Example 1 | 87.1% | 6.7% | 5.4% | 0.8% | 48.1% | 2.13 |
| Example 2 | 80.4% | 13.4% | 5.4% | 0.8% | 31.6% | 2.07 |
| Example 3 | 73.8% | 20.1% | 5.4% | 0.8% | 23.7% | 2.06 |
| Example 4 | 66.2% | 27.7% | 5.4% | 0.8% | 18.3% | 2.02 |
| Comparative Example 1 | 2.7% | 6.7% | 5.4% | 85.2% | 93.1% | 1.4 |
| Comparative Example 2 | 2.9% | 13.4% | 5.4% | 78.3% | 86.2% | 1.45 |
| Comparative Example 3 | 3.1% | 20.1% | 5.4% | 71.5% | 79.4% | 1.47 |
| Comparative Example 4 | 3.2% | 27.7% | 5.4% | 63.7% | 71.4% | 1.53 |

REFERENCE SIGNS LIST

1: ultraviolet light-emitting element.
10: support substrate
11: light extraction surface
20: semiconductor layer
21: n-type semiconductor layer
22: light-emitting layer
23: p-type semiconductor layer
31: n-type electrode 31
32: p-type electrode

The invention claimed is:

1. An ultraviolet light-emitting element comprising:
a support substrate;
a group III-V nitride semiconductor layer structure mounted on a mounting surface of the support substrate, the layer structure including an n-type semiconductor layer, a light-emitting layer, a p-type cladding layer and a p-type contact layer which are stacked in this order on the support substrate;
an n-type electrode mounted on the n-type semiconductor layer; and
a p-type electrode mounted on the p-type contact layer,
wherein:
the support substrate has an indented portion formed on at least a part of a light emitting surface of the support substrate opposite to a mounting surface of the n-type semiconductor layer, and
an area of the n-type semiconductor layer surface, being an exposed area which is exposed to the outside at an area of the ultraviolet light-emitting element, is at least 20% and at most 90% in largeness, and exposed areas of the p-type contact layer surface and the p-type electrode surface which are exposed to the outside at a remaining area are at least 5% and at most 50% in largeness.

2. The ultraviolet light-emitting element according to claim 1, wherein the n-type semiconductor layer has a refractive index of at least 2.0 at an emission wavelength.

3. The ultraviolet light-emitting element according to claim 1, wherein the support substrate has an absorption coefficient of at most 30 cm$^{-1}$ at an emission wavelength.

4. The ultraviolet light-emitting element according to claim 1, wherein the n-type semiconductor layer has an absorption coefficient of at most 10 cm$^{-1}$ at an emission wavelength.

5. The ultraviolet light-emitting element according to claim 1, wherein the support substrate is an AlN single crystal substrate.

6. The ultraviolet light-emitting element according to claim 1, wherein the p-type cladding layer is a p-type AlGaN layer represented by a composition formula $Al_xGa_{1-x}N$ ($0<X\leq1$), and the p-type contact layer is a p-type AlGaN layer represented by a composition formula $Al_yGa_{1-y}N$ ($0<Y\leq1$, and $Y\leq X$).

* * * * *